United States Patent
Kim et al.

(10) Patent No.: US 8,610,493 B2
(45) Date of Patent: Dec. 17, 2013

(54) BIAS CIRCUIT AND ANALOG INTEGRATED CIRCUIT COMPRISING THE SAME

(75) Inventors: Yi-Gyeong Kim, Daejeon (KR); Bong Chan Kim, Seoul (KR); Min-Hyung Cho, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 75 days.

(21) Appl. No.: 13/243,955

(22) Filed: Sep. 23, 2011

(65) Prior Publication Data

US 2012/0154028 A1 Jun. 21, 2012

(30) Foreign Application Priority Data

Dec. 15, 2010 (KR) .......................... 10-2010-0128376

(51) Int. Cl.
*G05F 3/02* (2006.01)
(52) U.S. Cl.
USPC ............ 327/541; 327/543; 323/299; 323/311
(58) Field of Classification Search
None
See application file for complete search history.

(56) References Cited

U.S. PATENT DOCUMENTS

| | | | |
|---|---|---|---|
| 6,522,111 B2 * | 2/2003 | Zadeh et al. | 323/277 |
| 6,586,987 B2 * | 7/2003 | Somerville et al. | 327/542 |
| 7,786,801 B2 | 8/2010 | Kim | |
| 8,054,052 B2 * | 11/2011 | Noda | 323/265 |

FOREIGN PATENT DOCUMENTS

| KR | 1020060028119 A | 3/2006 |
|---|---|---|
| KR | 1020090053642 A | 5/2009 |

* cited by examiner

*Primary Examiner* — Lincoln Donovan
*Assistant Examiner* — Terry L Englund

(57) ABSTRACT

Disclosed is a bias circuit which includes a bias voltage generating part configured to generate a bias voltage using a reference current and a variable current; a reference current source part configured to provide the reference current to the bias voltage generating part; and a current adjusting part configured to provide the variable current to the bias voltage generating part and to adjust the amount of the variable current according to voltage levels of at least two input signals. The bias circuit prevents an increase in power consumption and improves a slew rate at the same time.

17 Claims, 8 Drawing Sheets

BIAS CIRCUIT AND ANALOG INTEGRATED CIRCUIT COMPRISING THE SAME

CROSS-REFERENCE TO RELATED APPLICATIONS

This application claims the benefits, under 35 U.S.C. §119, of Korean Patent Application No. 10-2010-0128376 filed Dec. 15, 2010, the entirety of which is incorporated by reference herein.

BACKGROUND

Exemplary embodiments relate to an analog integrated circuit, and more particularly, relate to a bias circuit of an analog integrated circuit.

A switched-capacitor circuit may be widely used to design analog integrated circuits such as an analog-to-digital converter (ADC), a digital-to-analog converter (DAC), a sigma-delta analog-to-digital converter, and the like. The switched-capacitor circuit may necessitate an excellent settling characteristic to secure an exact operation of the analog integrated circuit.

A settling time of the settling characteristic of the switched-capacitor circuit may be reduced by increasing a bandwidth and a slew rate. In particular, if the slew rate is low, the settling time of the switched-capacitor circuit may increase due to a long slew time.

SUMMARY

A bias circuit and an analog integrated circuit including the same may be provided to improve a slew rate.

One aspect of embodiments of the inventive concept is directed to provide a bias circuit which comprises a bias voltage generating part configured to generate a bias voltage using a reference current and a variable current; a reference current source part configured to provide the reference current to the bias voltage generating part; and a current adjusting part configured to provide the variable current to the bias voltage generating part and to adjust the amount of the variable current according to voltage levels of at least two input signals.

In this embodiment, the bias circuit further comprises a source follower part configured to receive the at least two input signals and to increase or decrease the voltage levels of the at least two input signals.

In this embodiment, the source follower part comprises a first source follower configured to receive first and second input signals of the at least two input signals and to output first and second signals having voltage levels lower than the first and second input signals; and a second source follower configured to receive the first and second input signals and to output third and fourth signals having voltage levels higher than the first and second input signals.

In this embodiment, the current adjusting part comprises a first branch configured to form a current path for providing the variable current to the bias voltage generating part in response to the first and fourth signals; and a second branch configured to form a current path for providing the variable current to the bias voltage generating part in response to the second and third signals.

In this embodiment, if a voltage level of the first input signal is identical to that of the second input signal, the first and second branches break the current paths for providing the variable current to the bias voltage generating part.

In this embodiment, if a voltage difference between the first and second input signals is over a predetermined level, one of the first and second branches forms the current path for providing the variable current to the bias voltage generating part.

In this embodiment, the first branch includes a first transistor forming a current path in response to the first signal and a second transistor forming a current path in response to the fourth signal, and the second branch includes a third transistor forming a current path in response to the second signal and a fourth transistor forming a current path in response to the third signal.

In this embodiment, the first and third transistors are formed of a PMOS transistor and the second and fourth transistors are formed of an NMOS transistor. The first and second transistors in the first branch are connected in series each other and the third and fourth transistors in the second branch are connected in series each other.

In this embodiment, each of the source follower part and the current adjusting part includes a plurality of transistors and sizes of transistors in the source follower are larger than those in the current adjusting part.

Another aspect of embodiments of the inventive concept is directed to provide an analog integrated circuit which comprises an operational amplifier configured to receive and amplify at least two input signals; and a bias circuit configured to receive the at least two input signals and to supply a bias voltage to the operational amplifier, wherein the bias circuit adjusts a voltage level of the bias voltage supplied to the operational amplifier according to voltage levels of the at least two input signals.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
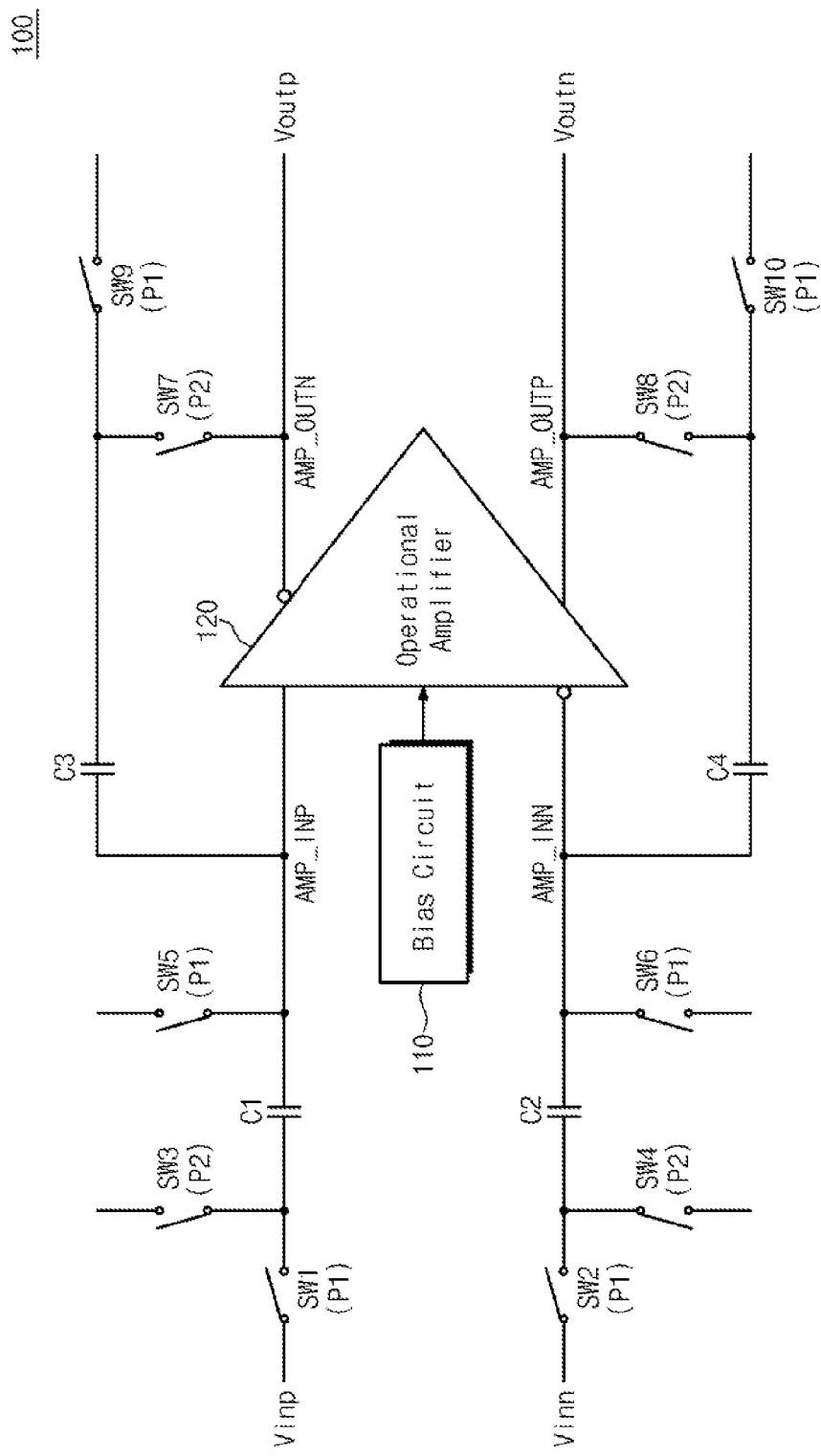
FIG. 1 is a diagram illustrating a switched-capacitor circuit according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating a switched-capacitor circuit according to an exemplary embodiment of the inventive concept. In FIG. 1, a sample-and-hold circuit (hereinafter, referred to as an S/H circuit) is exemplarily illustrated as an example of a switched-capacitor circuit. For ease of description, it is assumed that the switched-capacitor circuit 100 receives two input signals Vinp and Vinn. However, the inventive concept is not limited thereto. For example, the switched-capacitor circuit 100 may receive at least two input signals. Referring to FIG. 1, the switched-capacitor circuit 100 may include a plurality of switches SW1 to SW10, a plurality of capacitors C1 to C4, a bias circuit 110, and an operational amplifier 120.

Figure 2:
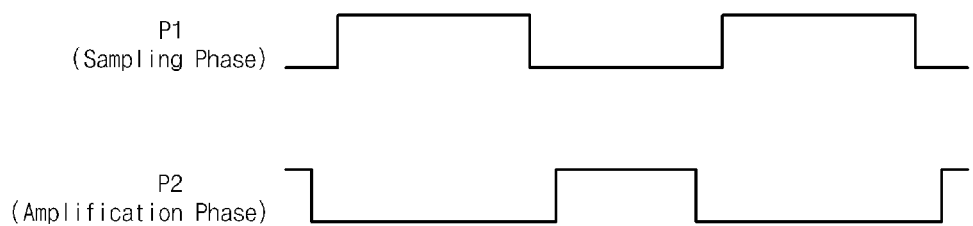
FIG. 2 is a timing diagram illustrating a sampling phase P1 and an amplification phase P2 for controlling a sampling operation and an amplification operation of a switched-capacitor circuit in FIG. 1.

FIG. 2 is a timing diagram illustrating a sampling phase P1 and an amplification phase P2 for controlling a sampling operation and an amplification operation of a switched-capacitor circuit in FIG. 1. If the sampling phase P1 is at a logic high level, a sampling operation may be carried. If the amplification phase P2 is at a logic high level, an amplification operation may be performed.

Referring to FIGS. 1 and 2, when the sampling phase P1 is at a logic high level, switches SW1, SW2, SW5, SW6, SW9, and SW10 may be turned on. At this time, the first and second input signals Vinp and Vinn may be sampled by the first and second capacitors C1 and C2, respectively. A voltage difference between the first and second input signals Vinp and Vinn may be referred to as a differential input signal.

When the amplification phase P2 is at a logic high level, switches SW3, SW4, SW7, and SW8 may be turned on. At this time, the differential input signal may be amplified, and the first and second output signals Voutp and Voutn may be issued. A voltage difference between the first and second output signals Voutp and Voutn may be referred to as a differential output signal.

Figure 3:
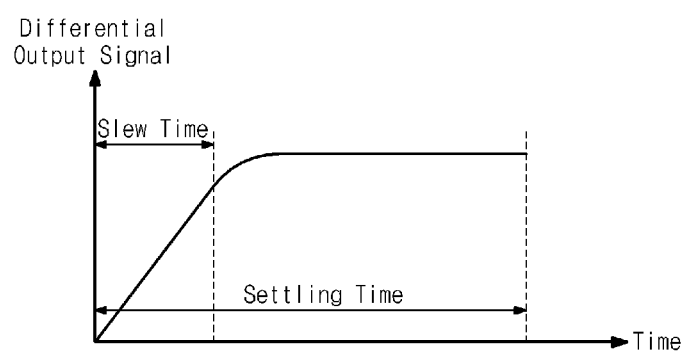
FIGS. 3 and 4 are diagrams illustrating a settling time according to a slew rate of a switched-capacitor circuit in FIG. 1.
Figure 4:
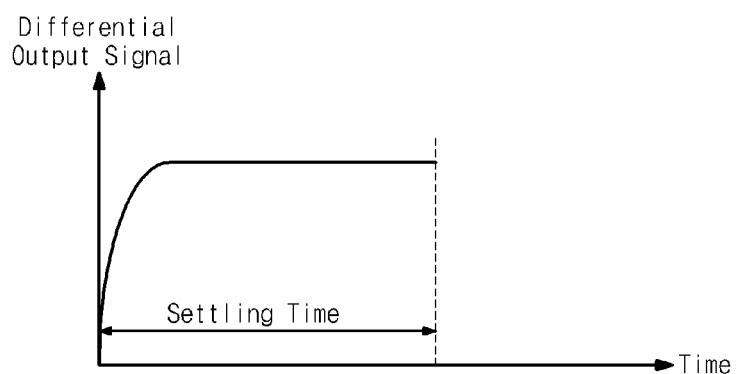

FIGS. 3 and 4 are diagrams illustrating a settling time according to a slew rate of a switched-capacitor circuit in FIG. 1. A settling time when a switched-capacitor circuit 100 has a low slew rate is illustrated in FIG. 3, and a settling time when the switched-capacitor circuit 100 has a high slew rate is illustrated in FIG. 4.

As illustrated in FIG. 3, if the switched-capacitor circuit 100 has a low slew rate, a slew time may be generated, and a settling time may increase due to the slew time. A long settling time may hinder a high-speed operation of the switched-capacitor circuit 100. For this reason, a high-speed operation of the switched-capacitor circuit 100 may be accomplished by improving a slew rate. The slew rate may be expressed by the following equation.

$$SR = dVo/dt = Ibs/C2$$

$$Vo = Voutp - Voutn$$

Herein, 'SR' may indicate a slew rate, and 'Vo' may indicate a differential output signal. 'Ibs' may indicate a maximum current signal capable of being supplied to an operational amplifier. The slew rate may be improved by reducing a size of a capacitor or increasing the maximum current signal Ibs of the operational amplifier. A method of improving a slew rate by adjusting a capacitor size of the switched-capacitor circuit 100 may cause an increase in noise and lowering of the stability. The switched-capacitor circuit 100 in FIG. 1 may improve the slew rate by increasing the maximum current signal Ibs of the operational amplifier.

A method of increasing the maximum current signal Ibs of the operational amplifier may cause an increase in power consumption. That is, power consumption may increase by increasing the maximum current signal Ibs regardless of a magnitude of a differential input signal (i.e., a voltage difference between the first input signal Vinp and the second input signal Vinn). Below, a switched-capacitor circuit according to another exemplary embodiment of the inventive concept will be more fully described. As will be described below, the switched-capacitor circuit according to another exemplary embodiment of the inventive concept may prevent an increase in power consumption and may improve a slew rate at the same time.

Figure 5:
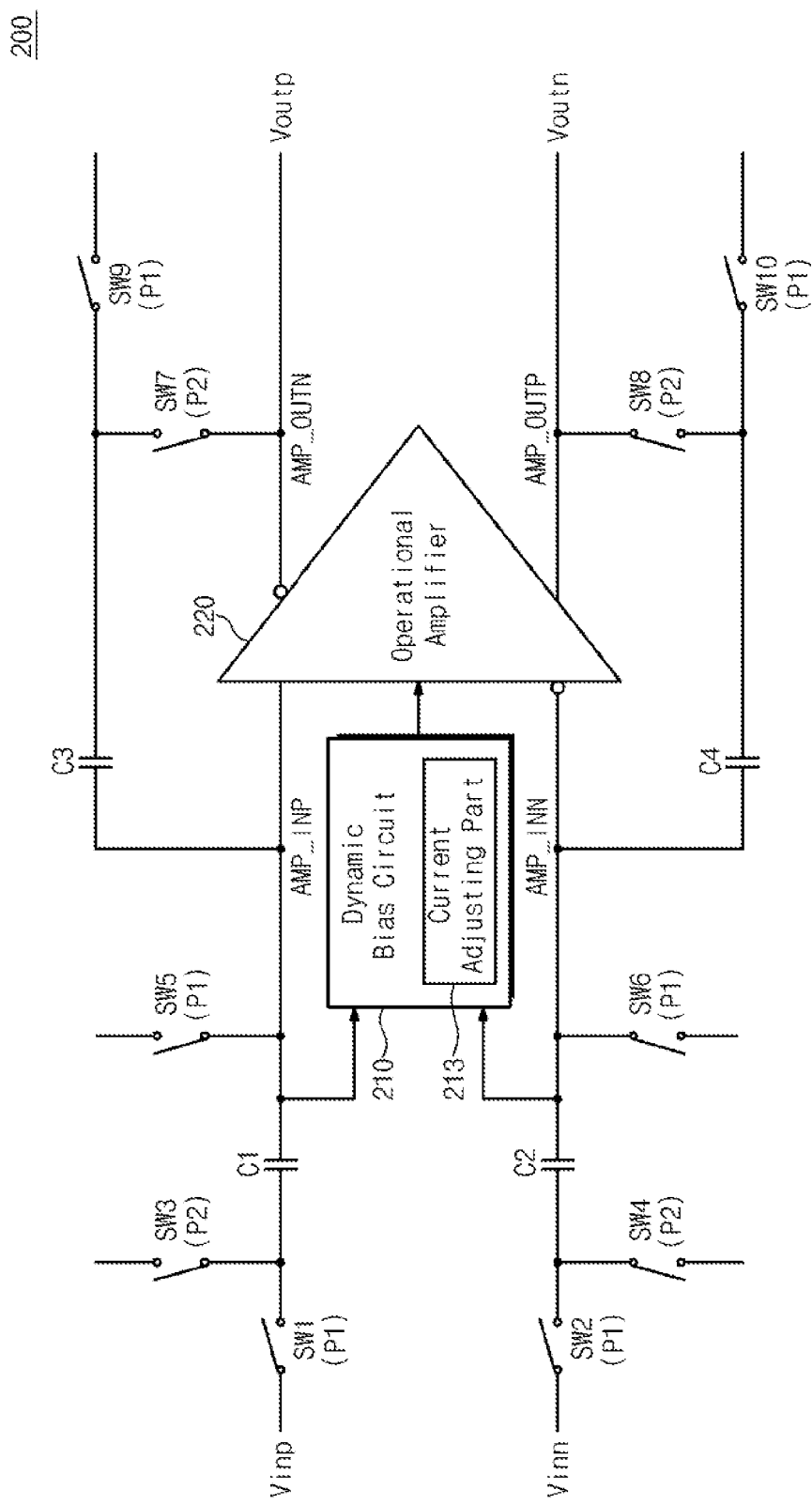
FIG. 5 is a block diagram illustrating a switched-capacitor circuit according to another exemplary embodiment of the inventive concept.

FIG. 5 is a block diagram illustrating a switched-capacitor circuit according to another exemplary embodiment of the inventive concept. In FIG. 5, an S/H circuit is exemplarily illustrated as an example of a switched-capacitor circuit 200. Like FIG. 1, for ease of description, it is assumed that the switched-capacitor circuit 100 receives two input signals Vinp and Vinn. However, the inventive concept is not limited thereto. For example, the switched-capacitor circuit 200 may receive at least two input signals.

The switched-capacitor circuit 200 in FIG. 5 may be similar to that in FIG. 1. A difference between the switched-capacitor circuits 100 and 200 in FIGS. 1 and 5 will be described.

Referring to FIG. 5, the switched-capacitor circuit 200 may include a plurality of switches SW1 to SW10, a plurality of capacitors C1 to C4, a dynamic bias circuit 210, and an operational amplifier 220. Unlike the switched-capacitor circuit 100 in FIG. 1, the switched-capacitor circuit 200 may include the dynamic bias circuit 210. The dynamic bias circuit 210 may include a current adjusting part 213.

While a bias circuit 100 in FIG. 1 supplies a fixed bias voltage (or, a bias current) to an operational amplifier 120 in FIG. 1, the dynamic bias circuit 210 in FIG. 5 may provide the operational amplifier 220 with a bias voltage (or, a bias current) varied according to a magnitude of a differential input signal. For example, as a magnitude of the differential input signal becomes large (i.e., as a voltage difference between the first and second input signals Vinp and Vinn becomes large), the dynamic bias circuit 210 may provide a high level of a bias voltage to the operational amplifier.

As a level of the bias voltage is controlled according to a magnitude of the differential input signal, the switched-capacitor circuit 200 may improve a slew rate to power consumption as compared with the switched-capacitor circuit 100 in FIG. 1. The dynamic bias circuit 210 will be more fully described with reference to FIGS. 6 and 7.

Figure 6:
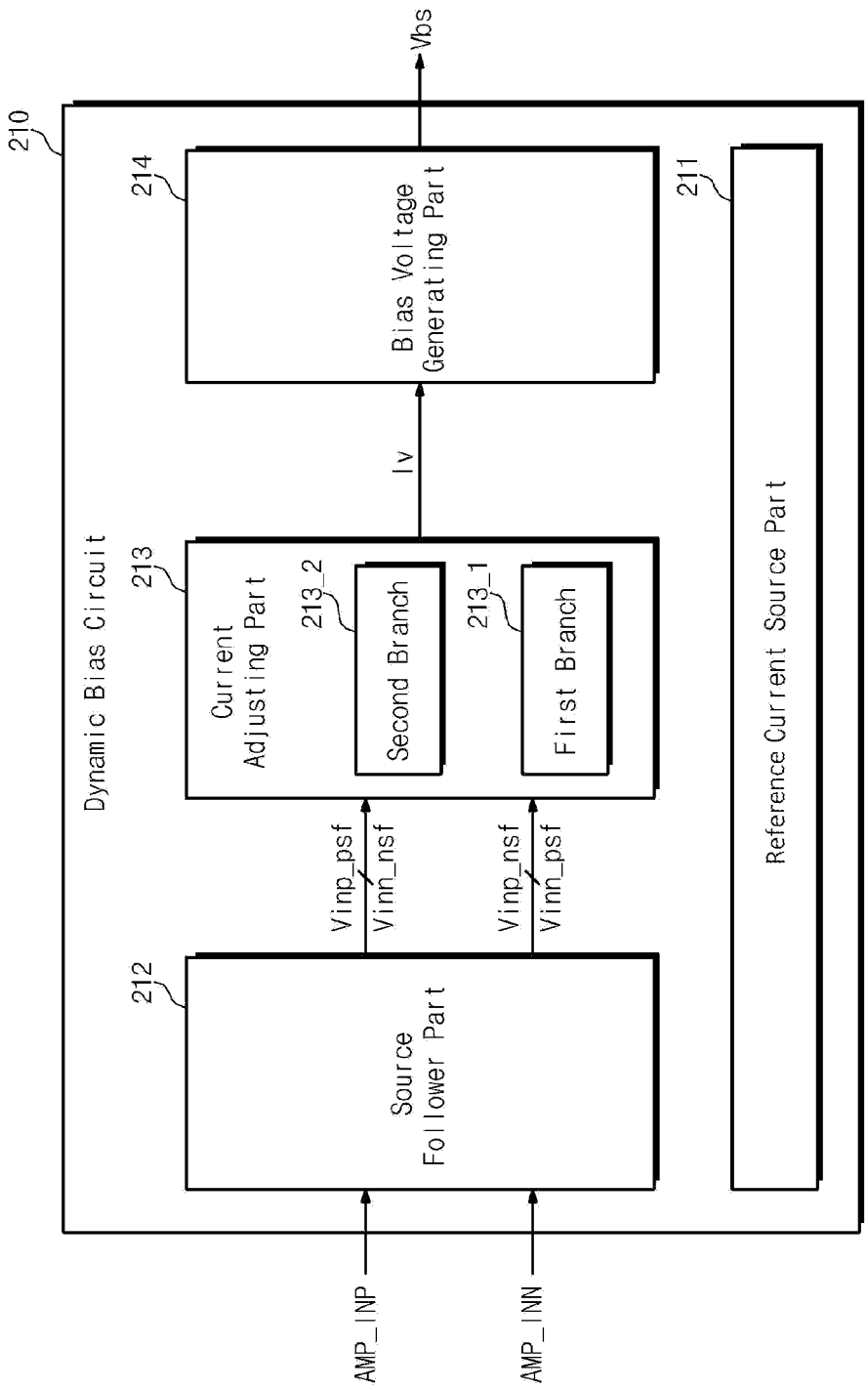
FIG. 6 is a block diagram illustrating a dynamic bias circuit in FIG. 5 according to an exemplary embodiment of the inventive concept.

FIG. 6 is a block diagram illustrating a dynamic bias circuit in FIG. 5 according to an exemplary embodiment of the inventive concept. Referring to FIG. 6, a dynamic bias circuit 210 may include a reference current source part 211, a source follower part 212, a current adjusting part 213, and a bias voltage generating part 214.

The reference current source part 211 may provide a current source to the dynamic bias circuit 210. For example, the reference current source part 211 may generate a reference current to supply it to the source follower part 212 and the bias voltage generating part 214.

The source follower part 212 may receive the first amplifier input signal AMP_INP and the second amplifier input signal AMP_INN. Herein, the first amplifier input signal AMP_INP and the second amplifier input signal AMP_INN may be provided to an operational amplifier 220, respectively. A voltage difference between the first amplifier input signal AMP_INP and the second amplifier input signal AMP_INN may be proportional to a voltage difference (i.e., a differential input signal) between the first input signal Vinp and the second input signal Vinn.

The source follower part 212 may have a predetermined voltage gain (e.g., a voltage gain of 1), and may generate a plurality of voltages Vinp_psf, Vinn_nsf, Vinp_nsf, and Vinn_psf. Herein, the voltages Vinp_nsf and Vinn_nsf may be lower in level than the first and second amplifier input signal AMP_INP and AMP_INN, respectively. The voltages Vinp_psf and Vinn_psf may be higher in level than the first and second amplifier input signal AMP_INP and AMP_INN, respectively.

The current adjusting part 213 may include the first branch 213_1 and the second branch 213_2. The first branch 213_1 may receive the voltages Vinn_psf and Vinn_nsf from the source follower part 212, and the second branch 213_2 may receive the voltages Vinp_psf and Vinn_nsf from the source follower part 212. The current adjusting part 213 may provide a variable current Iv to the bias voltage generating part 214.

The current adjusting part 213 may adjust the amount of the variable current Iv provided to the bias voltage generating part 214 according to the voltages Vinp_psf, Vinn_nsf, Vinp_nsf, and Vinn_psf input from the source follower part 212. That is, the current adjusting part 213 may adjust the amount of the variable current Iv according to a voltage difference between the first and second amplifier input signal AMP_INP and AMP_INN.

If a voltage difference between the first and second amplifier input signal AMP_INP and AMP_INN is less than a predetermined level, the first and second branches 213_1 and 213_2 may be turned off, and no variable current Iv may be supplied to the bias voltage generating part 214.

If a voltage difference between the first and second amplifier input signal AMP_INP and AMP_INN is more than a predetermined level, the first or second branch 213_1 or 213_2 may be turned on, and the variable current Iv may be supplied to the bias voltage generating part 214. In this case, the amount of the variable current Iv provided to the bias voltage generating part 214 may be proportional to a voltage difference between the first and second amplifier input signal AMP_INP and AMP_INN.

The bias voltage generating part 214 may receive a reference current from the reference current source part 211 and the variable current Iv from the current adjusting part. The bias voltage generating part 214 may generate a bias voltage Vbs for an operational amplifier 220 in FIG. 5 using the reference current and the variable current Iv. Since the amount of the variable current Iv is proportional to a voltage difference between the first and second amplifier input signal AMP_INP and AMP_INN, a voltage level of the bias voltage Vbs may be varied according to a voltage difference between the first and second amplifier input signal AMP_INP and AMP_INN.

Figure 7:
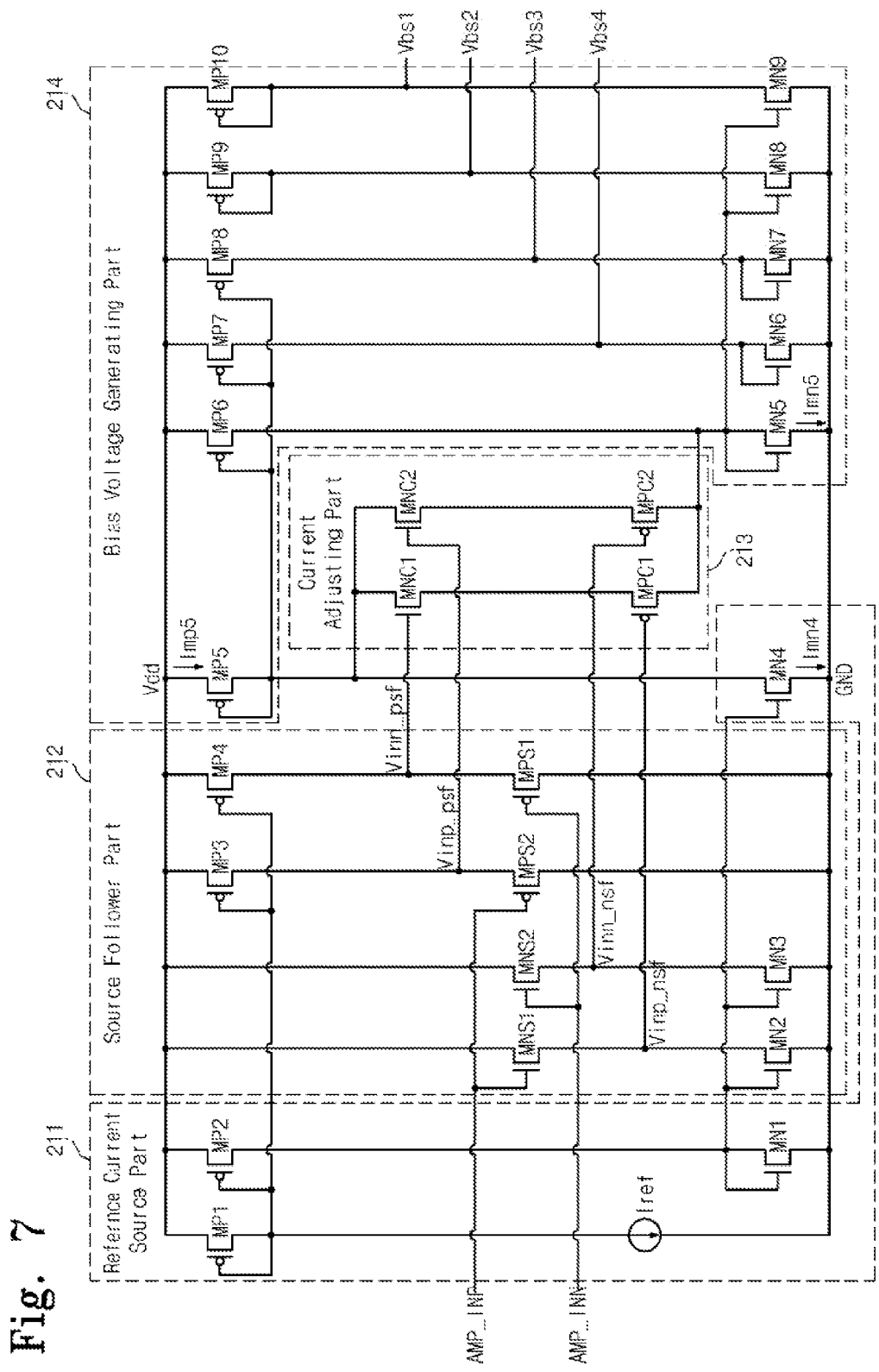
FIG. 7 is a circuit diagram illustrating a dynamic bias circuit in FIG. 6.

FIG. 7 is a circuit diagram illustrating a dynamic bias circuit in FIG. 6.

A reference current source part 211 may include a plurality of transistors MP1, MP2, MN1, and MN4. The reference current source part 211 may generate a reference current Iref and may provide a current to a source follower part 212 and a bias voltage generating part 214 using a current mirror structure.

The source follower part 212 may include a plurality of transistors MN2, MN3, MP3, MP4, MNS1, MNS2, MPS1, and MPs2. PMOS transistors MPS1 and MP4 may constitute a PMOS source follower, and PMOS transistors MPS2 and MP3 may constitute a PMOS source follower. NMOS transistors MNS1 and MN2 may constitute an NMOS source follower, and NMOS transistors MNS2 and MN3 may constitute an NMOS source follower.

The source follower part 212 may receive the first amplifier input signal AMP_INP, and may generate voltages Vinp_nsf and Vinp_psf via the NMOS source follower MNS1 and MN2 and the PMOS source follower MPS2 and MP3, respectively. The source follower part 212 may receive the second amplifier input signal AMP_INN, and may generate voltages Vinn_nsf and Vinn_psf via the NMOS source follower MNS2 and MN3 and the PMOS source follower MPS1 and MP4, respectively.

Herein, the voltage Vinp_nsf may have a voltage level lower by a gate-source voltage Vgsn of a transistor MNS1 than a voltage level of the first amplifier input signal AMP_INP. The voltage Vinn_nsf may have a voltage level lower by a gate-source voltage Vgsn of a transistor MNS2 than a voltage level of the second amplifier input signal AMP_INN. Further, the voltage Vinp_psf may have a voltage level lower by a gate-source voltage Vgsn of a transistor MPS2 than a voltage level of the first amplifier input signal AMP_INP. The voltage Vinn_psf may have a voltage level lower by a gate-source voltage Vgsn of a transistor MPS1 than a voltage level of the second amplifier input signal AMP_INN.

The current adjusting part 213 may be formed of two branches, each of which is formed of a PMOS transistor and an NMOS transistor. In particular, the first branch may be formed of a PMOS transistor MPC1 and an NMOS transistor MNC1. The PMOS transistor MPC1 and the NMOS transistor MNC1 in the first branch may form current paths in response to the voltage Vinp_nsf and the voltage Vinn_psf, respectively. The second branch may be formed of a PMOS transistor MPC2 and an NMOS transistor MNC2. The PMOS transistor MPC2 and the NMOS transistor MNC2 in the second branch may form current paths in response to the voltage Vinn_nsf and the voltage Vinp_psf, respectively.

The transistors MPC1, MPC2, MNC1, and MNC2 of the current adjusting part 213 may be designed to have less sizes (or, a width/length ratio) than the transistors MNS1, MNS2, MPS1, and MPS2 of the source follower part 212.

The bias voltage generating part 214 may include a plurality of transistors MN5 to MN9 and MP5 to MP10. The bias voltage generating part 214 may generate bias voltages Vbs1 to Vbs4 for an operational amplifier 220 in FIG. 5 using a current Imn5 flowing via a transistor MN5 and a current Imp5 flowing via a transistor MP5. The bias voltage generating part 214 may generate four bias voltages. However, the inventive concept is not limited thereto. The number of bias voltages generated by the bias voltage generating part 214 may be determined variously.

Below, an operation of the dynamic bias circuit will be more fully described. For ease of description, there will be described the cases that a voltage level of the first amplifier input signal AMP_INP is identical to that of the second amplifier input signal AMP_INN and that a voltage level of the first amplifier input signal AMP_INP is higher than that of the second amplifier input signal AMP_INN.

In the event that a voltage level of the first amplifier input signal AMP_INP is identical to that of the second amplifier input signal AMP_INN, a voltage difference (Vinn_psf−Vinp_nsf) of voltages provided to transistors MPC1 and MNC1 of the first branch may become (Vgsp+Vgsn). Since a size (or, a width/length ratio) of transistors of a current adjusting part 213 is smaller than that of transistors of a source follower part 212, the transistors MPC1 and MNC1 of the first branch may be turned off due to the voltage difference being (Vgsp+Vgsn).

Like transistors MPC1 and MNC1 of the first branch, a voltage difference (Vinn_psf−Vinp_nsf) of voltages provided to transistors MPC2 and MNC2 of the second branch may become (Vgsp+Vgsn). Like the transistors MPC1 and MNC1 of the first branch, the transistors MPC2 and MNC2 of the second branch may be turned off.

As a result, the current adjusting part 213 may break a current path of a current (i.e., a variable current Iv in FIG. 6) provided to the bias voltage generating part 214 via the first or second branch. Accordingly, a current flowing via transistors MN5 and MP5 of the bias voltage generating part 214 may be identical in amount to a current Imn4 flowing via a transistor MN4 of the reference current source part 211. The bias voltage generating part 214 may generate the bias voltages Vbs1 to Vbs4 on the basis of the current Imn4.

Below, the case that a voltage level of the first amplifier input signal AMP_INP is higher than that of the second amplifier input signal AMP_INN will be described. In this case, it is assumed that a difference between the first amplifier input signal AMP_INP and the second amplifier input signal AMP_INN is Vdiff.

In the event that a difference between the first amplifier input signal AMP_INP and the second amplifier input signal AMP_INN is Vdiff, a voltage difference (Vinn_psf−Vinp_nsf) of voltages provided to transistors MPC1 and MNC1 of the first branch may become (Vgsp+Vgsn−Vdiff). Accordingly, the transistors MPC1 and MNC1 of the first branch may be turned off.

However, a voltage difference (Vinn_psf−Vinp_nsf) of voltages provided to the transistors MPC2 and MNC2 of the second branch may become (Vgsp+Vgsn+Vdiff). Accordingly, the transistors MPC2 and MNC2 of the second branch may be turned on. In this case, the higher a voltage level of Vdiff, the more the amount of a current (i.e., a variable current Iv) flowing via the transistors MPC2 and MNC2 of the second branch.

A current Imp5 flowing via a transistor MP5 of the bias voltage generating part 214 and a current Imn5 flowing via a transistors MN5 thereof may increase by the amount corresponding to a sum of a current Imn4 provided to the reference current source part 211 and the variable current Iv provided from the current adjusting part 213. Accordingly, the bias voltage generating part 214 may generate high bias voltages Vbs1 to Vbs4 as a voltage difference between the first and second amplifier input signals AMP_INP and AMP_INN becomes large.

As a voltage difference between the first input signal Vinp and the second input signal Vinn becomes large, the dynamic bias circuit 210 may provide a high level of a bias voltage to an operational amplifier 220 in FIG. 5. A slew rate may be improved by increasing a maximum current signal Ibs using the bias voltages Vbs1 to Vbs4.

In a case where a voltage level of the second amplifier input signal AMP_INN is higher than that of the first amplifier input signal AMP_INP, the transistors MPC1 and MNC1 of the first branch may be turned on, and the transistors MPC2 and MNC2 of the second branch may be turned on. This may be similar to the case that a voltage level of the first amplifier input signal AMP_INP is higher than that of the second amplifier input signal AMP_INN, and description thereof is thus omitted.

In FIGS. 6 and 7, the dynamic bias circuit 210 may receive two amplifier input signals AMP_INN and AMP_INP. However, the inventive concept is not limited thereto. For example, the dynamic bias circuit 210 may receive at least two amplifier input signals.

Figure 8:
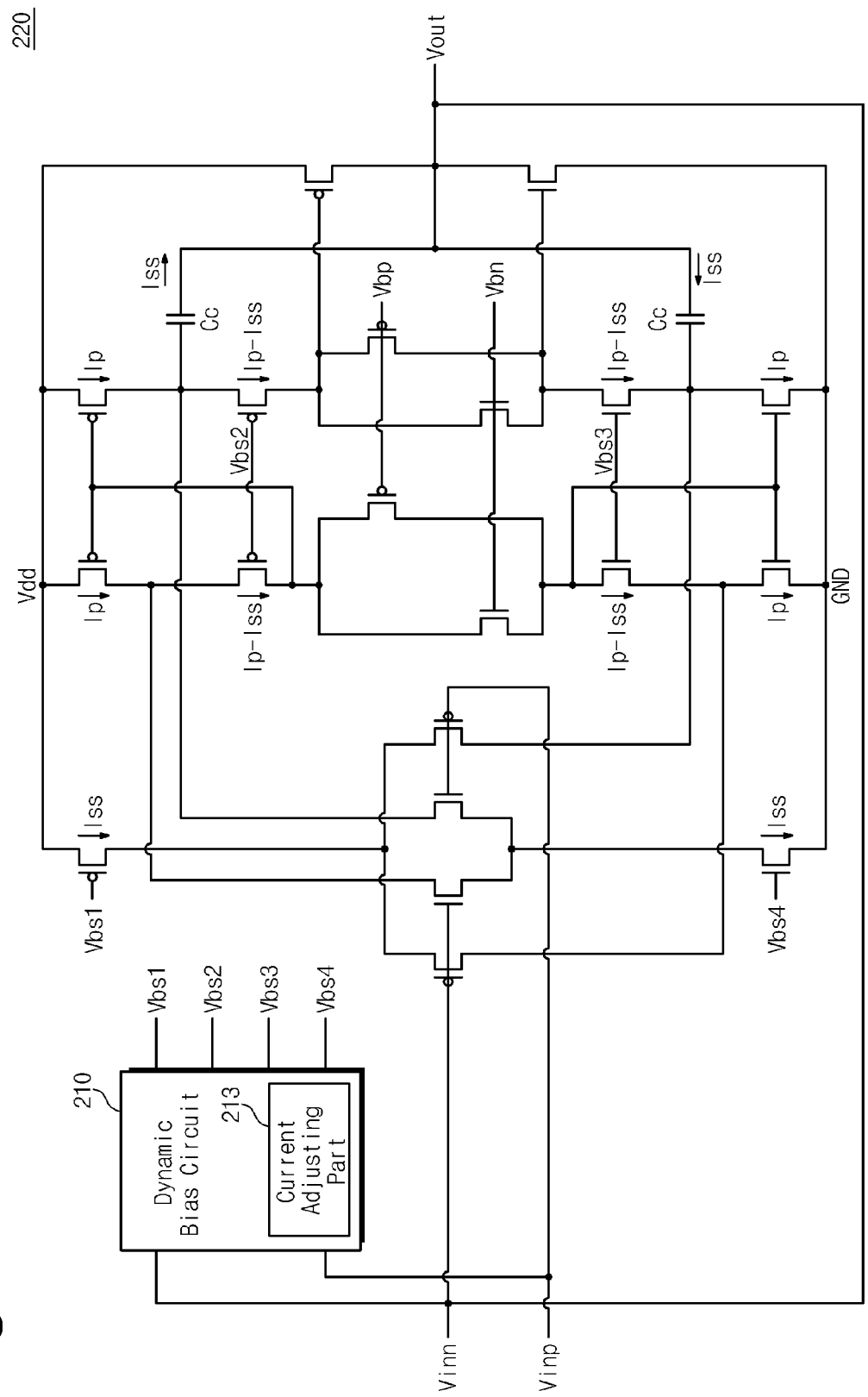
FIG. 8 is a circuit diagram illustrating an operational amplifier supplied with bias voltages from a dynamic bias circuit in FIG. 6.

FIG. 8 is a circuit diagram illustrating an operational amplifier supplied with bias voltages from a dynamic bias circuit in FIG. 6. For ease of description, it is assumed that an operational amplifier 220 in FIG. 8 receives two input signals Vinp and Vinn and four bias voltages Vbs1 to Vbs4. However, the inventive concept is not limited thereto. The number of input signals and bias voltages provided to the operational amplifier may be changed variously.

Referring to FIG. 8, a rail-to-rail cascode operational amplifier is exemplarily illustrated as an example of an operational amplifier. The rail-to-rail cascode operational amplifier may be used as a source driver of a liquid crystal display device, as well known in the art. A slew time of the operational amplifier 220 in FIG. 8 may be proportional to a time taken to discharge or charge a capacitor Cc, and may be determined according to a size of the capacitor Cc and an inner current Iss.

The operational amplifier in FIG. 8 may be supplied with bias voltages Vbs1 to Vbs4 from the dynamic bias circuit 210 in FIG. 6. Voltages Vbp and Vbn may be also supplied to the operational amplifier. Internal currents Ip, Iss, and Ip−Iss flow through transistors in the operation amplifier as shown in FIG. 8. In the event that a large differential input signal is provided to the operational amplifier 220 (i.e., a voltage difference between the first input signal Vinp and the second input signal Vinn is large), an internal current Iss of the operational amplifier may increase. This means that a slew rate of the operational amplifier 220 is improved.

As described in FIGS. 5 to 8, the dynamic bias circuit 210 may be applied to an S/H circuit. However, the inventive concept is not limited thereto. For example, the dynamic bias circuit 210 can be applied to various analog integrated circuits.

Figure 9:
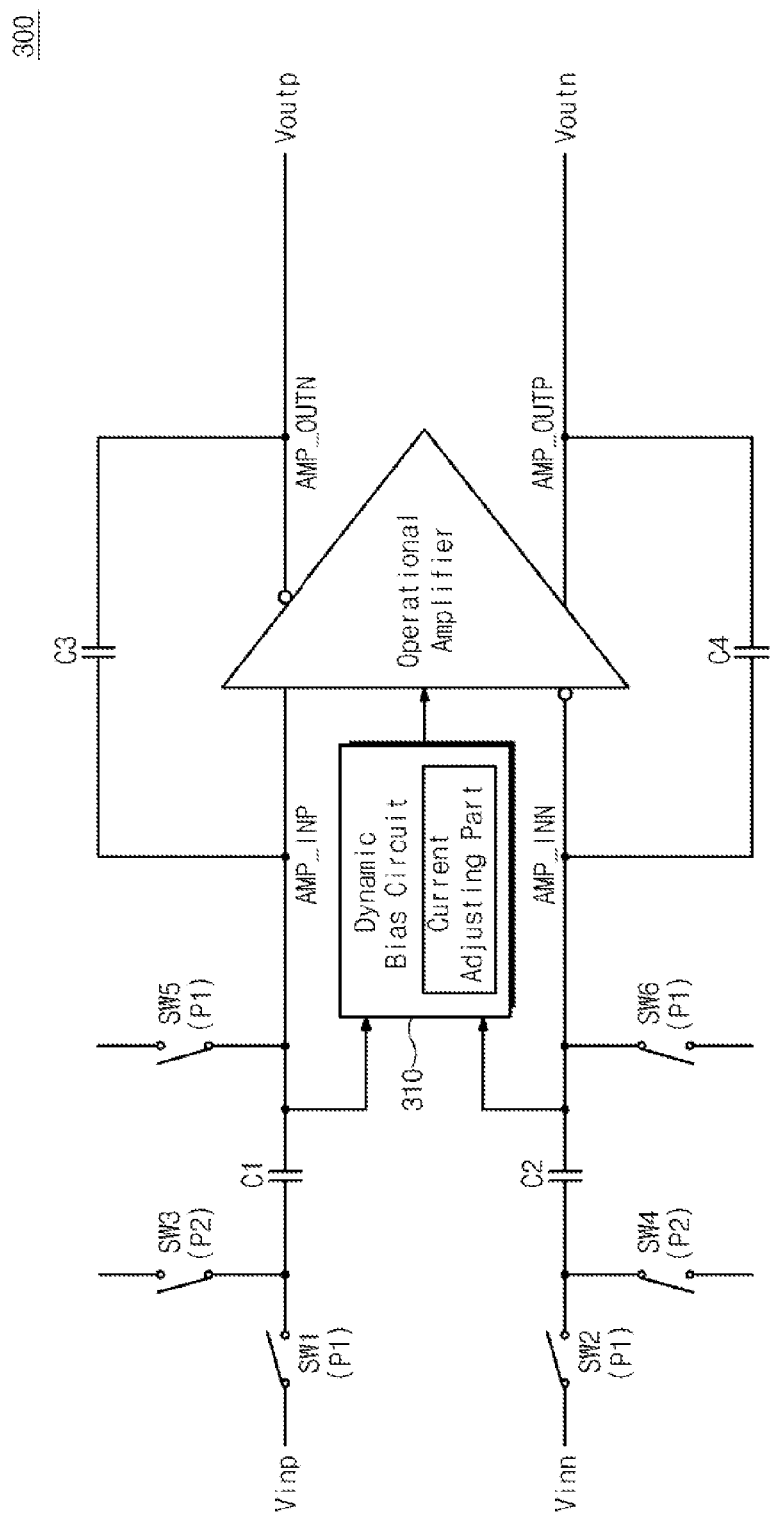
FIG. 9 is a diagram illustrating a switched-capacitor integrator including a dynamic bias circuit according to an exemplary embodiment of the inventive concept.

FIG. 9 is a diagram illustrating a switched-capacitor integrator including a dynamic bias circuit according to an exemplary embodiment of the inventive concept. For ease of description, it is assumed that a switched-capacitor integrator 300 in FIG. 9 receives two input signals Vinp and Vinn. However, the inventive concept is not limited thereto. For example, the switched-capacitor integrator 300 in FIG. 9 can receive at least two input signals.

The switched-capacitor integrator 300 in FIG. 9 may be mainly used at an analog filter or a sigma-delta ADC. The switched-capacitor integrator 300 may perform a switching operation according to a sampling phase P1 and an integration phase P2, and may the sampling and integration phases P1 and P2 may be similar to sampling and amplification phases P1 and P2 in FIG. 2.

The switched-capacitor integrator 300 may include a dynamic bias circuit 310. The dynamic bias circuit 310 may be configured the same as that 210 described with reference to FIGS. 6 and 7. Accordingly, like the S/H circuit, the switched-capacitor integrator 300 may prevent an increase in power consumption and improve a slew rate at the same time.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A bias circuit comprising:
    a bias voltage generating part configured to generate a bias voltage using a reference current and a variable current;
    a reference current source part configured to provide the reference current to the bias voltage generating part; and
    a current adjusting part configured to provide the variable current to the bias voltage generating part and to adjust the amount of the variable current according to voltage levels of at least two input signals,
    wherein a level of the generated bias voltage varies according to the voltage levels of the at least two input signals.

2. The bias circuit of claim 1, further comprising:
    a source follower part configured to receive the at least two input signals and to generate output signals having different voltage levels from the voltage levels of the at least two input signals.

3. The bias circuit of claim 2, wherein the source follower part comprises:
    a first source follower configured to receive first and second input signals of the at least two input signals and to output first and second signals having voltage levels lower than the first and second input signals; and
    a second source follower configured to receive the first and second input signals and to output third and fourth signals having voltage levels higher than the first and second input signals.

4. The bias circuit of claim 3, wherein the current adjusting part comprises:
    a first branch configured to form a first current path for providing the variable current to the bias voltage generating part in response to the first and fourth signals; and
    a second branch configured to form a second current path for providing the variable current to the bias voltage generating part in response to the second and third signals.

5. The bias circuit of claim 4, wherein if a voltage level of the first input signal is identical to that of the second input signal, the first and second branches break the current paths for providing the variable current to the bias voltage generating part.

6. The bias circuit of claim 4, wherein if a voltage difference between the first and second input signals is over a predetermined level, one of the first and second branches forms the current path for providing the variable current to the bias voltage generating part.

7. The bias circuit of claim 4, wherein the first branch includes a first transistor and a second transistor forming the first current path in response to the first signal and the fourth signal, respectively, and the second branch includes a third transistor and a fourth transistor forming the second current path in response to the second signal and the third signal, respectively.

8. The bias circuit of claim 7, wherein the first and third transistors are each formed of a PMOS transistor and the second and fourth transistors are each formed of an NMOS transistor, and
    wherein the first and second transistors in the first branch are connected in series with each other and the third and fourth transistors in the second branch are connected in series with each other.

9. The bias circuit of claim 2, wherein each of the source follower part and the current adjusting part includes a plurality of transistors and sizes of transistors in the source follower part are larger than those in the current adjusting part.

10. A bias circuit comprising:
    a bias voltage generating part configured to generate a bias voltage using a reference current and a variable current;
    a reference current source part configured to provide the reference current to the bias voltage generating part;
    a current adjusting part configured to provide the variable current to the bias voltage generating part and to adjust the amount of the variable current according to voltage levels of at least two input signals; and a source follower part configured to receive the at least two input signals and to generate output signals having different voltage levels from the voltage levels of the at least two input signals.

11. The bias circuit of claim 10, wherein the source follower part comprises:

a first source follower configured to receive first and second input signals of the at least two input signals and to output first and second signals having voltage levels lower than the first and second input signals; and a second source follower configured to receive the first and second input signals and to output third and fourth signals having voltage levels higher than the first and second input signals.

12. The bias circuit of claim 11, wherein the current adjusting part comprises:

a first branch configured to form a first current path for providing the variable current to the bias voltage generating part in response to the first and fourth signals; and a second branch configured to form a second current path for providing the variable current to the bias voltage generating part in response to the second and third signals.

13. The bias circuit of claim 12, wherein if a voltage level of the first input signal is identical to that of the second input signal, the first and second branches break the current paths for providing the variable current to the bias voltage generating part.

14. The bias circuit of claim 12, wherein if a voltage difference between the first and second input signals is over a predetermined level, one of the first and second branches forms the current path for providing the variable current to the bias voltage generating part.

15. The bias circuit of claim 12, wherein the first branch includes a first transistor and a second transistor forming the first current path in response to the first signal and the fourth signal, respectively, and the second branch includes a third transistor and a fourth transistor forming the second current path in response to the second signal and the third signal, respectively.

16. The bias circuit of claim 15, wherein the first and third transistors are each formed of a PMOS transistor and the second and fourth transistors are each formed of an NMOS transistor, and wherein the first and second transistors in the first branch are connected in series with each other and the third and fourth transistors in the second branch are connected in series with each other.

17. The bias circuit of claim 10, wherein each of the source follower part and the current adjusting part includes a plurality of transistors and sizes of transistors in the source follower part are larger than those in the current adjusting part.

* * * * *